United States Patent [19]

Okude et al.

[11] Patent Number: 5,187,668
[45] Date of Patent: Feb. 16, 1993

[54] PLACEMENT OPTIMIZATION SYSTEM AIDED BY CAD

[75] Inventors: Hiroaki Okude; Masahiko Toyonaga; Toshiro Akino, all of Takatsuki, Japan

[73] Assignee: Matsushita Electric Industrial Co., Ltd., Osaka, Japan

[21] Appl. No.: 621,893

[22] Filed: Dec. 4, 1990

[30] Foreign Application Priority Data

Dec. 4, 1989 [JP] Japan ................................ 1-315619

[51] Int. Cl.$^5$ ............................................ G06F 15/60
[52] U.S. Cl. ..................................... 364/468; 364/491
[58] Field of Search ............... 364/148, 149, 150, 468, 364/469, 488, 489, 490, 491, 578

[56] References Cited

U.S. PATENT DOCUMENTS

| 4,495,559 | 1/1985 | Gelatt Jr. et al. | 364/148 |
| 4,613,941 | 9/1986 | Smith et al. | 364/490 |
| 4,615,011 | 9/1986 | Linsker | 364/491 |
| 4,630,219 | 12/1986 | DiGiacomo et al. | 364/488 |
| 4,754,408 | 6/1988 | Carpenter et al. | 364/491 |
| 4,815,003 | 3/1989 | Putatunda et al. | 364/491 |
| 4,918,614 | 4/1990 | Modarres et al. | 364/490 |

Primary Examiner—Jerry Smith
Assistant Examiner—Paul Gordon
Attorney, Agent, or Firm—Stevens, Davis, Miller & Mosher

[57] ABSTRACT

There is provided a placement optimization system for determining layout in printed circuits and semiconductor substrates, comprising input means for inputting circuit connection information, placement optimization means for deriving wiring density distribution on the basis of the circuit connection information, evaluating the height and/or width of the wiring region statistically estimated from the wiring density distribution, and output means for outputting the resultant placement position information. Further, the placement optimization system may comprise means for collecting placement elements into sets, determining placement of the sets, then developing the sets into elements, and determining optimum placement positions of the elements.

14 Claims, 17 Drawing Sheets

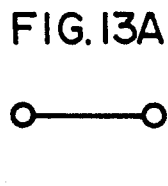 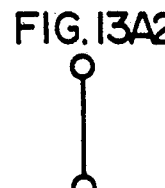 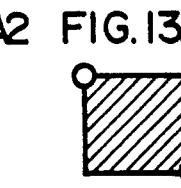 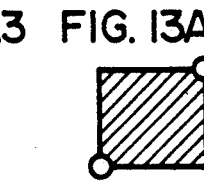
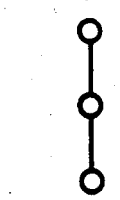 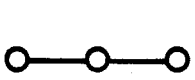 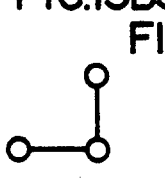 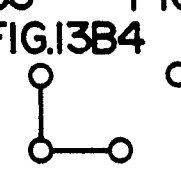 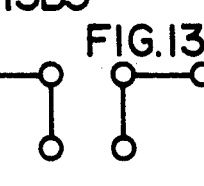
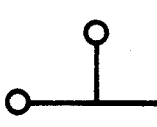 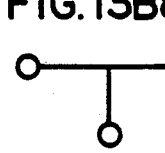 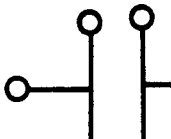 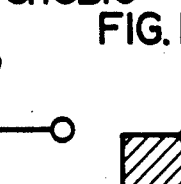 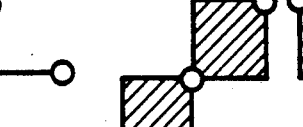 
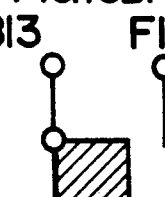 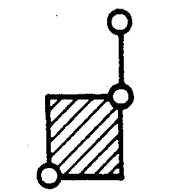 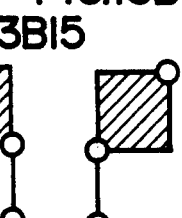 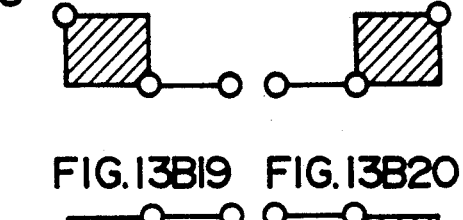  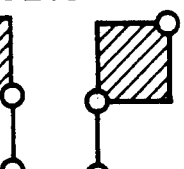  
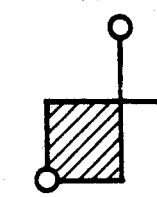 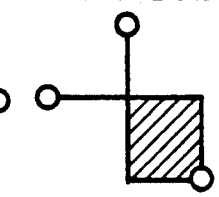 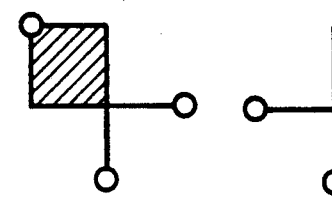 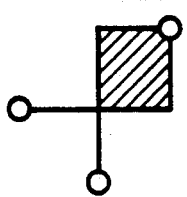

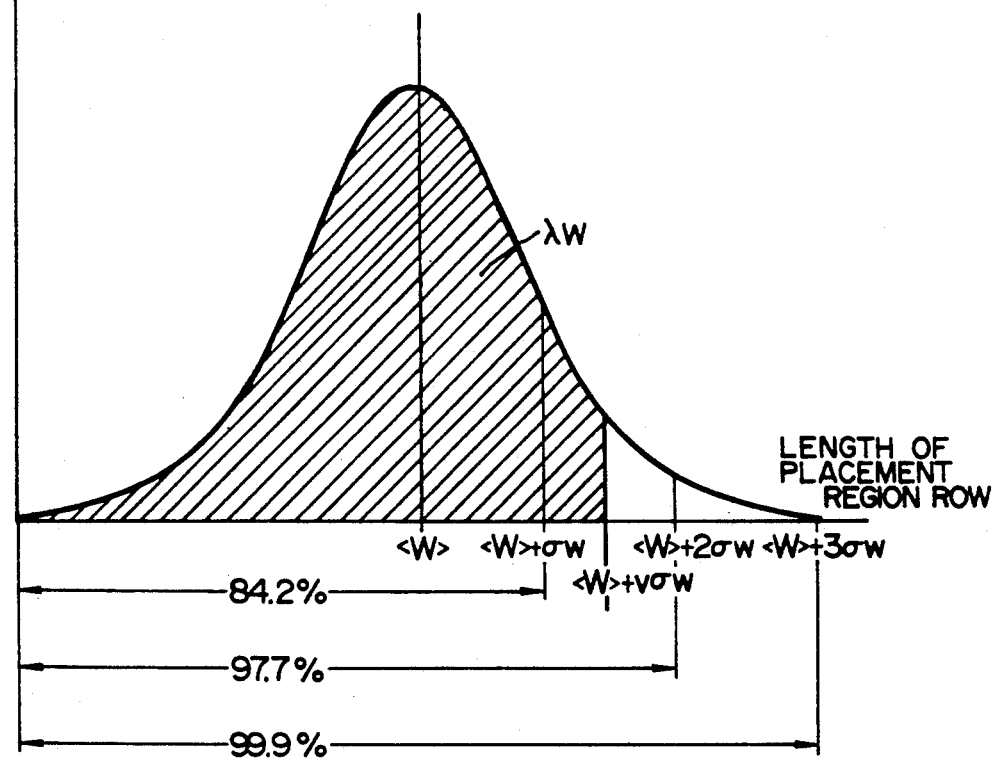
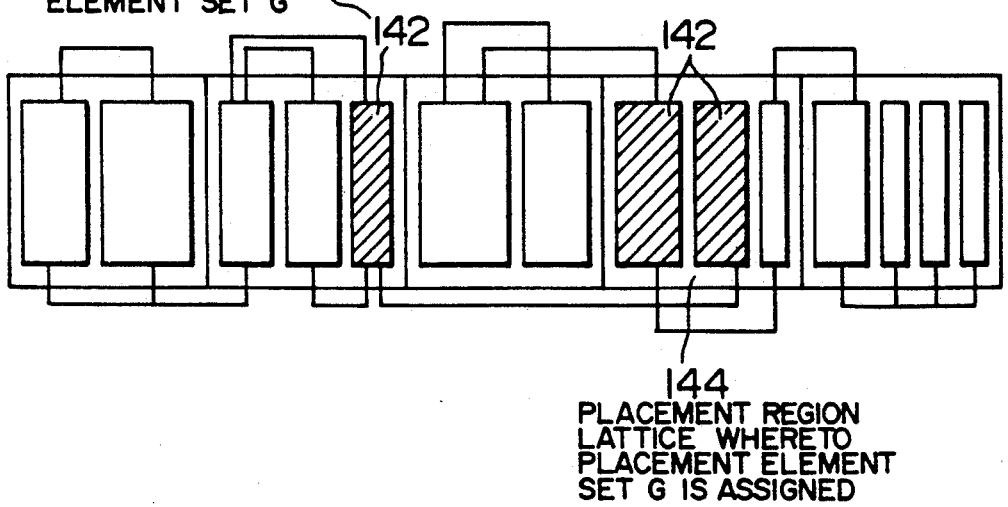

PLACEMENT OPTIMIZATION SYSTEM AIDED BY CAD

BACKGROUND OF THE INVENTION

1. Field of the Invention

The present invention relates to a placement optimization system aided by CAD (computer aided design) determining layout in a printed circuit board or a semiconductor substrate.

2. Description of the Related Art

A layout design system for printed circuit board or semiconductor substrate is realized typically by determining placement of elements to be mounted so as to make the area after layout small as far as possible and interconnecting those placement elements.

In determining positions of placement elements to be handled, there has been conventionally used a method of defining the estimated total wiring length and distribution of interconnecting wiring as items to be evaluated and of improving placement so as to minimize an evaluation function value calculated by using an evaluation function formed by combining the above described items. Items such as the estimated total wiring length among placement elements and wiring distribution are thus defined as component items of the placement evaluation function on the basis of the assumption that minimizing those values results in a minimized area of the final layout result.

Although there is correlation between the estimated total wiring length and the final area, for example, however, the correlation is not necessarily satisfied at all times. Even if the evaluation function value is minimum, the area is not minimum in some results. Further, distribution of interconnection wiring is detected by evaluating the area indirectly by means of a simple accumulator, the result of minimum area cannot be obtained accurately. Further, since a plurality of items which do not directly represent object properties are combined to perform evaluation, valid coefficients for determining evaluation weights of respective items change with the scale and characteristics of the circuit to be handled. In order to obtain a set of weight coefficients which become optimum with respect to the subject circuit, it is necessary to determine the set of coefficients by means of laborious experiments or experience.

SUMMARY OF THE INVENTION

The present invention solves problems of a conventional placement optimization technique for determining optimum placement positions of placement elements by forming an evaluation function of items representing the estimated total wiring length and distribution of wiring passage and by minimizing the evaluation function value calculated by using the above described evaluation function. That is to say, an object of the present invention is to provide a placement optimization system aided by CAD capable of saving labor for deriving the optimum value of the evaluation function with respect to circuits of all scales and capable of yielding placement results with a better quality.

Therefore, a placement optimization system aided by CAD of the present invention comprises input means for inputting circuit connection information including a plurality of placement elements, placement optimization means for optimizing placement positions of placement elements by evaluating the height of a wiring region statistically approximated from the distribution of the degree of wiring crowdedness, which is set on the basis of the above described circuit connection information, and by performing repetitive improvement, and output means for outputting placement position information derived by the above described placement optimization means.

In the placement optimization system aided by CAD according to the present invention, the placement optimization means preferably comprises placement element collection means for collecting a plurality of placement elements having close connection relations in circuit connection information into a plurality of placement element sets, the sets having equal areas, modeling means for modeling placement element sets and wiring region lattices derived by the above described placement element collection means into lattice-like models, placement element set placement optimization means for determining optimum placement positions in lattice-like models of all placement element sets by repeating placement improvement on the basis of connection information between the above described placement element sets, and set development means for opening the above described plurality of placement element sets and for determining placement positions of all placement elements forming respective placement element sets.

In order to achieve the above described object and optimize the placement positions of the above described placement elements in a circuit including mutually related placement elements, a placement optimization system aided by CAD according to a second aspect of the present invention comprises input means for inputting circuit connection information including a plurality of placement elements and shape information of the above described placement elements, initial placement means for initially placing the above described placement elements, placement alteration means for moving and interchanging the above described placement elements and for locally altering the placement positions, final area estimation means for calculating, on the basis of a placement state at each time of placement alteration, the area of the final layout result expected in the above described placement state and defining the calculated area as an evaluation function value, alteration condition jugment means for evaluating the difference between the above described evaluation function value calculated by the above described final area estimation means before the above described placement alteration and that after the above described placement alteration and thereby judging satisfaction of a given placement alteration condition;

placement alteration cancel means responsive to nonsatisfaction of the above described alteration condition in the above described alteration condition judgment means to cancel the above described placement alteration and restore the placement state and the evaluation function value to the state before the above described placement alteration, and end condition judgment means for judging satisfaction of a given end condition, said end condition judgment means being responsive to satisfaction of the end condition to cause processing advancement to output means for outputting placement position information of the above described placement elements and responsive to nonsatisfaction of the end condition to cause return to the above described placement alteration means.

In order to optimize the placement position of the above described placement element in a circuit including mutually related placement elements, a placement optimization system aided by CAD for achieving the above described object according to a third aspect of the present invention comprises input means for inputting circuit connection information including a plurality of placement elements and shape information of the above described placement elements, placement element collection means for generating placement element sets by collecting placement elements having close connection relations in the above described circuit connection information so as to make areas of resultant sets nearly equal each other, for defining the resultant placement element sets as new placement elements, for generating circuit connection information relating to the above described placement element sets, and for defining the circuit connection information as new circuit connection information, modeling means for assigning placement elements to placement region lattices of a lattice model including placement region lattices and wiring region lattices, placement alteration means for interchanging placement elements on the lattice model to perform local placement interchange, final area estimation means for calculating, on the basis of the placement state at each time of execution of placement alteration, the area of a final layout result expected in the above described placement state and for defining the area thus calculated as an evaluation function value, alteration condition jugment means for evaluating the difference between the above described evaluation function value calculated by the above described final area estimation means before the above described placement alteration and that after the above described placement alteration and for judging, on the basis of the result of the difference evaluation, necessity of placement alteration, placement alteration cancel means responsive to nonsatisfaction of the above described alteration condition in the above described alteration condition judgment means to cancel the above described placement alteration and restore the placement state and the evaluation function value to the state before the above described placement alteration, end condition judgment means for judging satisfaction of an end condition, said end condition judgment means being responsive to satisfaction of the end condition to cause advancement to succeeding processing and responsive to nonsatisfaction of the end condition to cause return to the above described placement alteration means, placement element set development means for opening all placement element sets assigned to respective placement region lattices of the above described lattice model and for determining placement positions of all placement elements at the time of input included in each placement element set, and output means for outputting placement position information.

In accordance with the first aspect of the present invention, the height of the wiring region statistically approximated from the distribution of the degree of wiring crowdedness, which is set on the basis of circuit connection information, is evaluated. Therefore, the labor of defining optimum values of a plurality of coefficients included in the evaluation function with respect to the circuit scale can be saved, and in addition, it is possible to optimize placement by evaluating the height directly relating to an area which is the original object.

In accordance with the second aspect of the present invention, the area of the final layout is estimated and defined as the evaluation function value, and placement improvement is so performed that the above described evaluation function value may be minimized. As a result, it is possible to determine such placement positions of placement elements as to minimize the final area while directly evaluating the area of the final layout and by evaluating a single item, i.e., area. In the conventional evaluation function, therefore, the labor of determining optimum values of a plurality of coefficients included in the evaluation function for determining the evaluation weights of each of a plurality of items having different properties with respect to the circuit scale can be saved.

In accordance with the third aspect of the present invention, placement elements having close connection relationship are collected into sets on the basis of circuit connection information so that sums of areas of all placement elements included in respective placement element sets may become equal, and placement improvement is performed on a lattice model by using the above described placement element sets as new placement elements. Therefore, the number of placement element which is the subject of placement improvement can be decreased. Further, at the time of placement alteration, the computer cost caused by interchanging placement elements having different widths can be reduced.

BRIEF DESCRIPTION OF THE DRAWINGS

FIGS. 13A1 to 13A4 are diagrams showing wiring path patterns in the case where the number of placement elements to be connected is two;

FIGS. 13B1 to 13B24 are diagrams showing wiring path patterns in the case where the number of placement elements to be connected is three;

FIGS. 19 and 20 are diagrams illustrating processing performed in final width estimation means of the present embodiment;

FIG. 22 is a diagram illustrating processing in placement element set development means of the present embodiment.

DESCRIPTION OF THE PREFERRED EMBODIMENTS

Embodiment 1

Figure 1:
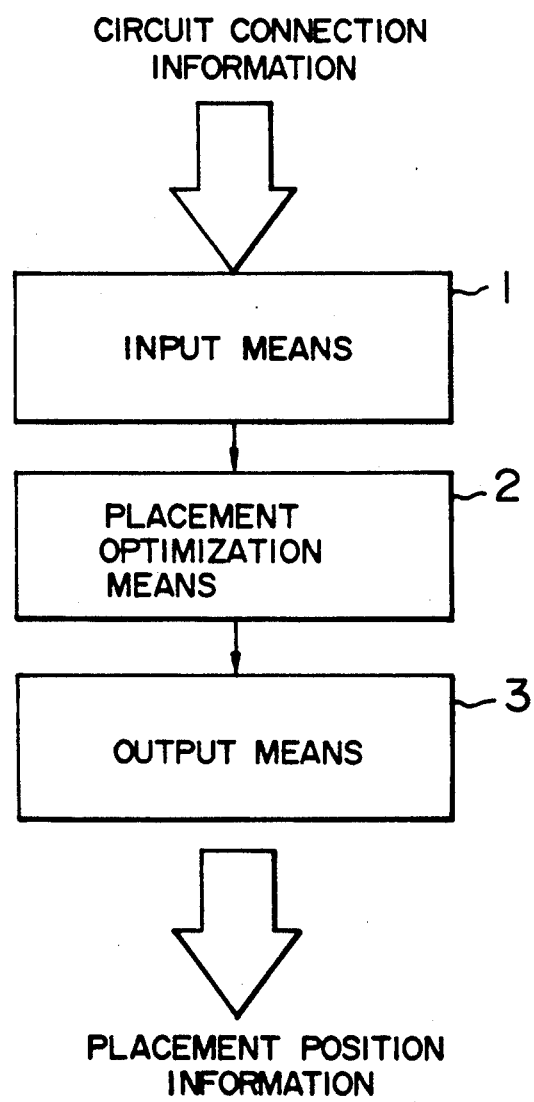
FIG. 1 is a block diagram illustrating the configuration of a placement optimization system aided by CAD according to a first embodiment of the present invention.

Configuration (processing flow) of a placement optimization system aided by CAD in an embodiment according to a first aspect of the present invention is shown in FIG. 1. The placement optimization system aided by this CAD comprises input means 1, placement optimization means 2 and output means 3.

In this placement optimization system aided by this CAD, circuit connection information representing circuit connection relations among a plurality of circuit elements to be disposed, i.e., a plurality of placement elements is first taken into the system by the input means 1. In the placement optimization means 2, placement positions of a plurality of placement elements are then determined by performing repeated improvement while evaluating the height of a wiring region, which is the measure of wiring crowdedness, statistically approximated from the distribution of the degree of wiring crowdedness, which is set on the basis of the circuit connection information. Finally, placement position information is outputted by the output means 3.

Table 1 shows an example of circuit connection information inputted by the input means 1.

TABLE 1

| Circuit connection information |
|---|
| N1 : P1(E1), P6(E3) |
| N2 : P2(E1), P8(E3), P13(E4) |
| N3 : P3(E1), P14(E5) |
| N4 : P4(E2), P10(E4) |
| N5 : P5(E2), P7(E3) |
| N6 : P12(E4), P15(E5) |
| N7 : P9(E3), P11(E4), P16(E5) |

With reference to Table 1, N1 to N7 denote nets and E1 to E5 denote placement elements. P1 to P16 denote terminals belonging to the placement elements E1 to E5. By nets N1 to N7 shown at the leftmost end, terminals P1 to P16 shown on the right side are connected. Characters enclosed in parentheses represent placement elements E1 to E5 whereto terminals P1 to P16 belong.

Figure 2:
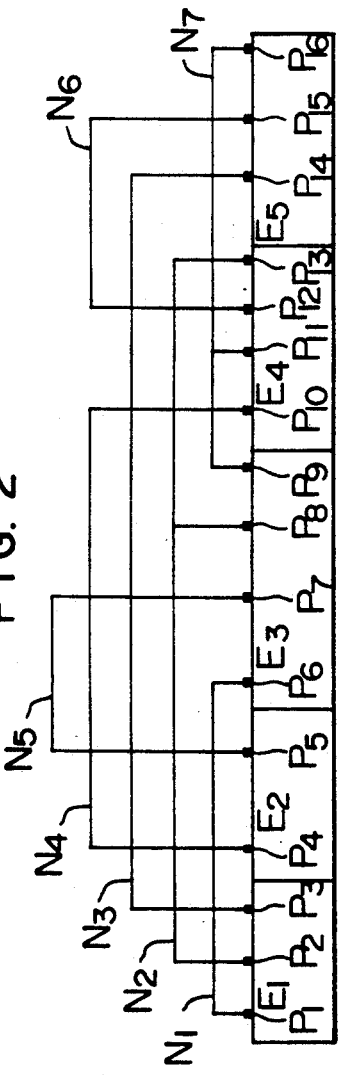
FIGS. 2, 3 and 4 are diagrams illustrating an evaluation method used in the placement optimization means of this embodiment.

FIG. 2 shows an example of placement wiring result satisfying the circuit connection information shown in Table 1. For brevity, however, the placement elements E1 to E5 are herein arranged in a lateral row.

Figure 3:
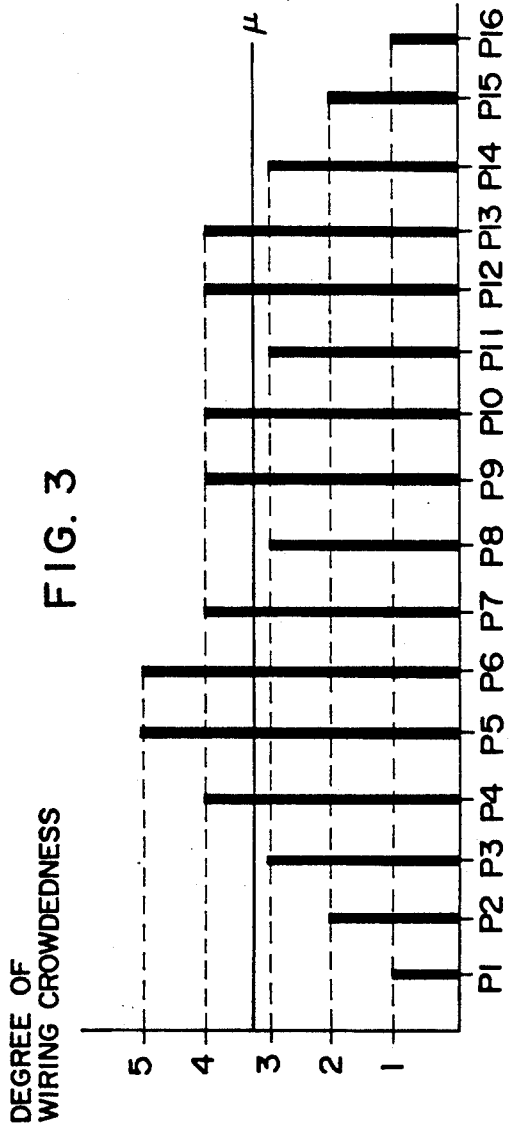

FIG. 3 shows distribution of the degree of wiring crowdedness on the terminals P1 to P16 in the placement wiring result illustrated in FIG. 2. A solid line $\mu$ represents the average value of degree of wiring crowdedness.

Figure 4:
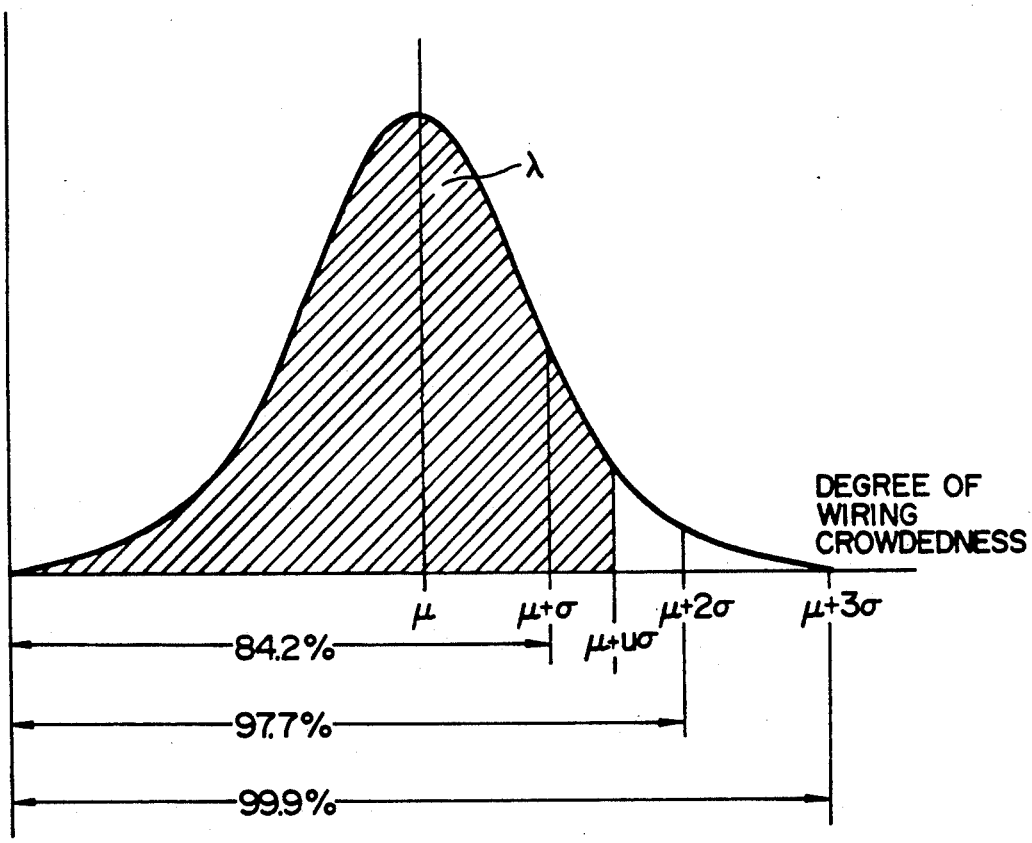

FIG. 4 shows an ideal diagram of a frequency curve as a function of degree of wiring crowdedness. For a large-scale problem, it is considered that the frequency distribution becomes the normal distribution as shown in FIG. 4. In FIG. 4, $\mu$ represents the average value of the degree of wiring crowdedness, and $\sigma$ represents the standard deviation value of the degree of wiring crowdedness. When coefficient u of the standard deviation value $\sigma$ of the degree of wiring crowdedness is an arbitrary value, distribution $\lambda$ represented by a shaded portion indicates the region of distribution of $\chi$ satisfying the following relation.

$$\chi < \mu + u\sigma \qquad (1)$$

As shown in FIG. 4, the shaded portion $\lambda$ contains distribution of 84.21% when the coefficient u has a value of 1. When the coefficient u has a value of 2, $\lambda$ contains distribution of 97.7%. When the coefficient u has a value of $\lambda$ contains distribution of 99.9%.

Herein, $\chi$ represents the height of the wiring region and it is an evaluation item directly relating to area minimization which is the original object of the placement optimization system aided by CAD.

The evaluation function of the placement optimization system used in this CAD will hereafter be described.

$$\chi_j = \mu_j + u \cdot \sigma_j \qquad (2)$$

$$\mu_j = (1/C_{maxj}) \cdot \sum_i C_{ij} = <C_j> \qquad (3)$$

$$\sigma_j = \left[ (1/C_{maxj}) \cdot \sum_i \left( C_{ij} - (1/C_{maxj}) \cdot \sum_i C_{ij} \right)^2 \right]^{\frac{1}{2}} \qquad (4)$$

$$= \left[ (1/C_{maxj}) \cdot \sum_i \left\{ C_{ij}^2 - (2/C_{maxj}) \cdot C_{ij} \cdot \sum_i C_{ij} + (1/C_{maxj})^2 \cdot \left( \sum_i C_{ij} \right)^2 \right\} \right]^{\frac{1}{2}}$$

$$= \left[ (1/C_{maxj}) \cdot \sum_i C_{ij}^2 - (1/C_{maxj})^2 \cdot \left( \sum_i C_{ij} \right)^2 \right]^{\frac{1}{2}}$$

$$= \left[ (1/C_{maxj}) \cdot \sum_i C_{ij}^2 - \left( (1/C_{maxj}) \cdot \sum_i C_{ij} \right)^2 \right]^{\frac{1}{2}}$$

$$= [<C_j^2> - <C_j>^2]^{\frac{1}{2}}$$

$$\chi_j = <C_j> + u \cdot <C_j^2> - <C_j>^2 \qquad (5)$$

$$H = \sum_j \chi_j \qquad (6)$$

$$= \sum_j (<C_j> + u \cdot <C_j^2> - <C_j>^2)$$

Here, $\chi_j$ represents the height of a wiring region in a j-th wiring region row statistically approximated.

$C_{ij}$ represents the degree of wiring crowdedness in an i-th wiring region of a j-th wiring region row, and $C_{maxj}$ represents the number of evaluation axes of the degree of wiring crowdedness in a j-th wiring region.

Character $\mu_j$, i.e., $<C_j>$ represents the average value of the degree $C_{ij}$ of wiring crowdedness in the j-th wiring region row, and $\sigma_j$ represents the standard deviation value thereof.

The height $\chi_j$ of this wiring region depends upon the maximum value of the degree $C_{ij}$ of wiring crowdedness in each wiring region. For statistical handling, however, the height $\chi_j$ is approximated by equation (2).

The average value $\mu_j$ and the standard deviation value $\sigma_j$ of the degree $C_{ij}$ of wiring crowdedness in the j-th wiring region row depend upon the placement state at each point of time, and they are derived by calculation according to equations (3) and (4).

Equation (5) represents the height $\chi_j$ of the j-th wiring region row. By adjusting the coefficient u, it is possible to determine what proportion of distribution of the degree $C_{ij}$ of wiring crowdedness is contained by the height approximating $\chi_j$. Equation (6) represents the evaluation function value H which is the sum of heights $\chi_j$ of all wiring region rows in case a plurality of wiring region rows are arranged longitudinally.

In this placement optimization system aided by CAD, positions of two placement elements arbitrarily selected are interchanged to generate a new placement state. The evaluation function value $H_B$ before placement interchange and the evaluation function value $H_A$ after placement interchange are then derived by using equation (6). Those evaluation function values $H_B$ and $H_A$ are compared. It is judged whether an interchange condition is satisfied or not. That is to say, it is judged whether the evaluation function value $H_A$ after placement interchange is smaller than the evaluation function value $H_B$ before placement interchange or not. If $H_A$ is smaller than $H_B$, the placement state after placement interchange is defined as a new placement state. If $H_A$ is larger than $H_B$, the placement state before placement interchange is restored.

This placement interchange and evaluation of the evaluation function value H are repeated until the placement improvement is unrecognizable a predetermined number of times. As a result, placement positions are determined. It is thus possible to obtain placement positions resulting from statistically approximating and evaluating the height of the wiring region which exerts a direct influence upon the area.

In accordance with the placement optimization system aided by CAD of the present invention, an evaluation function used in evaluating the placement improvement comprises terms of the average value and standard deviation value representing the height of the wiring region statistically approximated from the distribution of the degrees of wiring crowdedness in wiring regions. This evaluation function evaluates the height of the wiring region whereon the area which is the original object function depends. As a result, the labor of determining the optimum combination of weight functions of evaluation functions with respect to the circuit scale can be saved.

Figure 5:
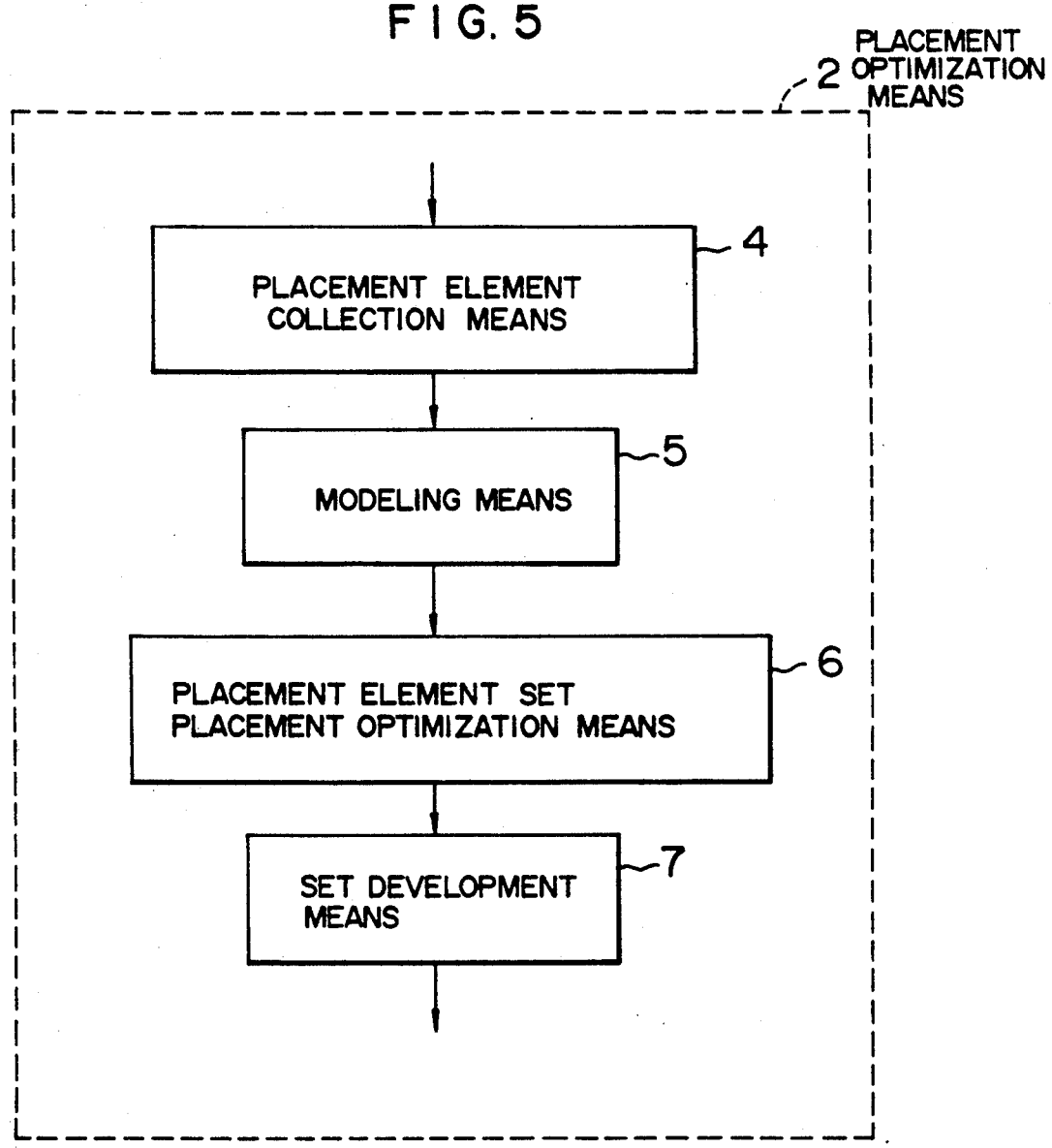
FIG. 5 is a block diagram showing the concrete configuration of the placement optimization means.

FIG. 5 shows an example of concrete configuration of the placement optimization means 2 in the present invention apparatus. With reference to FIG. 5, placement element collection means 4 collects a plurality of placement elements having close connection relations caused by wiring into a plurality of placement element sets having nearly equivalent areas and generates placement element set information representing the configuration of a plurality of placement element sets.

In this case, the above described placement element collection means 4 defines one placement element connected to wiring having two terminals as an element of the placement element set, takes another placement element connected to this element of the placement element set via the wiring having two terminals into the placement element set, and calculates the sum of widths of placement elements. This processing is repeated. When the sum of widths of all elements included in the placement element set now under generation exceeds a specified placement element set width, generation of the placement element set is completed and generation of a succeeding placement element set is started. Until all placement elements are assigned to any placement element sets, these processing operations are conducted to generate placement element sets.

All placement element sets generated by the above described placement element collection means 4 are assigned to lattice element of the lattice-like model in one-to-one correspondence by modeling means 5. At the same time, wiring region lattice elements are set into the lattice-like model.

Placement element set placement optimization means 6 repeats placement improvement and assigns all of the above described placement element sets to optimum positions of the above described lattice-like model. The placement element set placement optimization means 6 generates a new placement state by interchanging positions of two placement element sets arbitrarily selected, derives the evaluation function value $H_B$ before placement interchange and the evaluation function value $H_A$ after placement interchange by using equation (6), and compare those evaluation function values $H_A$ and $H_B$. If the evaluation function value $H_A$ after placement interchange is smaller than the evaluation function value $H_B$ before placement interchange, the placement state after placement interchange is adopted. If the evaluation function value $H_A$ after placement interchange is larger than the evaluation function value $H_B$ before placement interchange, the placement state before placement interchange is restored and defined as the current placement state.

This placement interchange and evaluation of the evaluation function value H are repeated until the placement improvement is unrecognizable a predetermined number of times. It is thus possible to determine placement positions of all placement element sets while statistically approximating and evaluating the height of the wiring region which exerts a direct influence on the area.

Set development means 7 then develops placement element sets, which are assigned to respective lattice elements by the above described placement element set placement optimization means 6, and determines placement positions of all placement elements included in each placement element set.

By interchanging positions of two placement elements arbitrarily selected out of placement elements included in placement element sets, the set development means 7 generates a new placement state. The set development means 7 then derives the estimated total wiring length before placement interchange and the estimated total wiring length after placement interchange, and compares them. If the estimated total wiring length after placement interchange is smaller than the estimated total wiring length before placement interchange, the set development means 7 adopts the placement state after placement interchange and defines it as the current placement state. If the estimated total wiring length after placement interchange is larger than the estimated total wiring length before placement interchange, the set development means 7 does not adopt the placement state after placement interchange but restores the placement state before placement interchange and defines it as the current placement state.

This placement interchange and evaluation of the estimated total wiring length are repeated until the placement improvement is unrecognizable a predetermined number of times. Placement positions of placement elements in the placement element set are thus determined.

Figure 6:
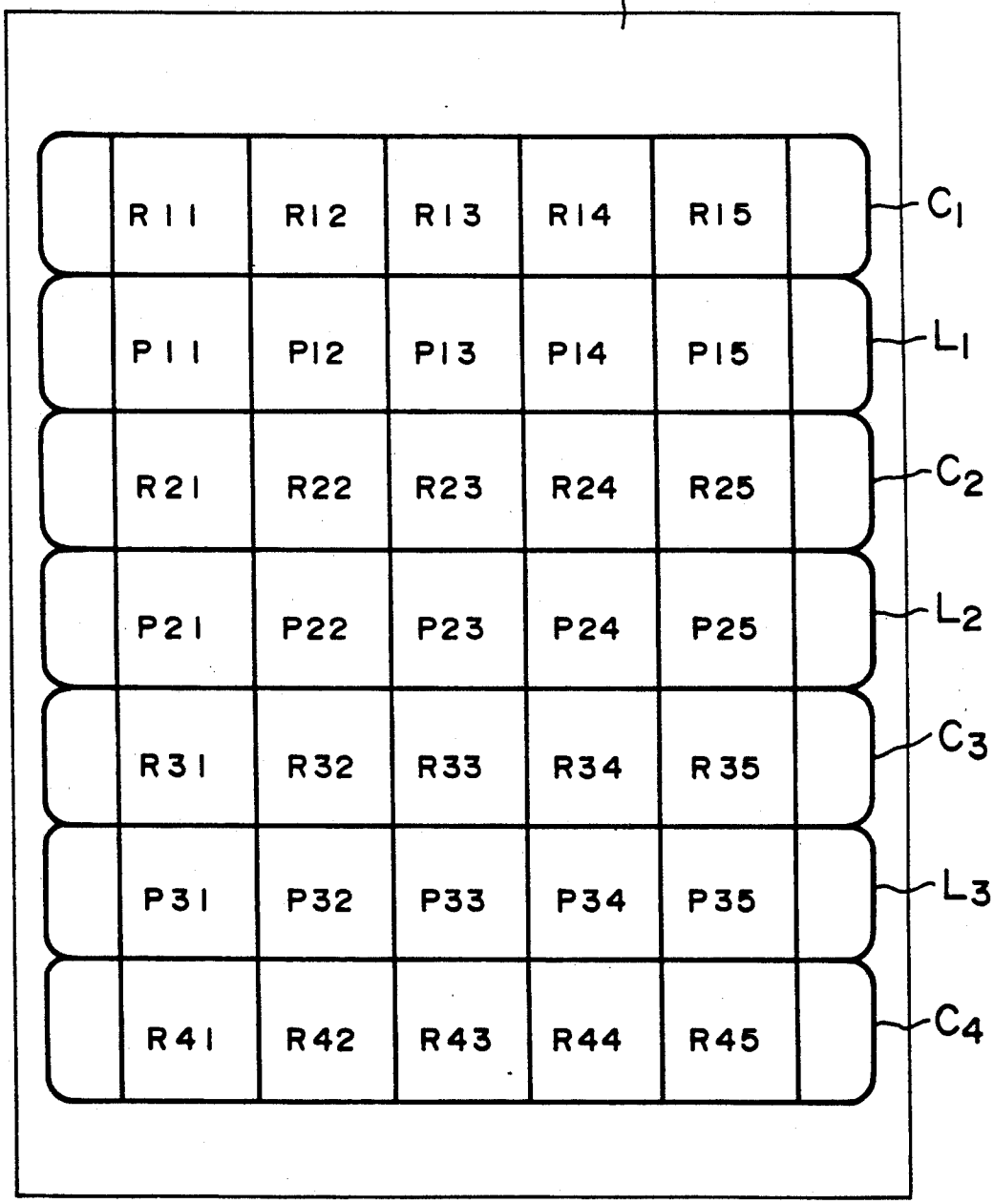
FIGS. 6 and 7 are diagrams illustrating the processing of modeling means.

FIG. 6 shows a lattice-like model 8 used by the above described modeling means 5. In the model shown herein, cell rows are distinguished from the wiring region like standard cells and gate arrays. L1 to L3 denote placement region lattice element rows. C1 to C4 denote wiring region lattice element rows. P11 to P35 denote placement region lattice elements whereto the above described placement element sets are assigned. R11 to R45 denote wiring region lattice elements.

Figure 7:
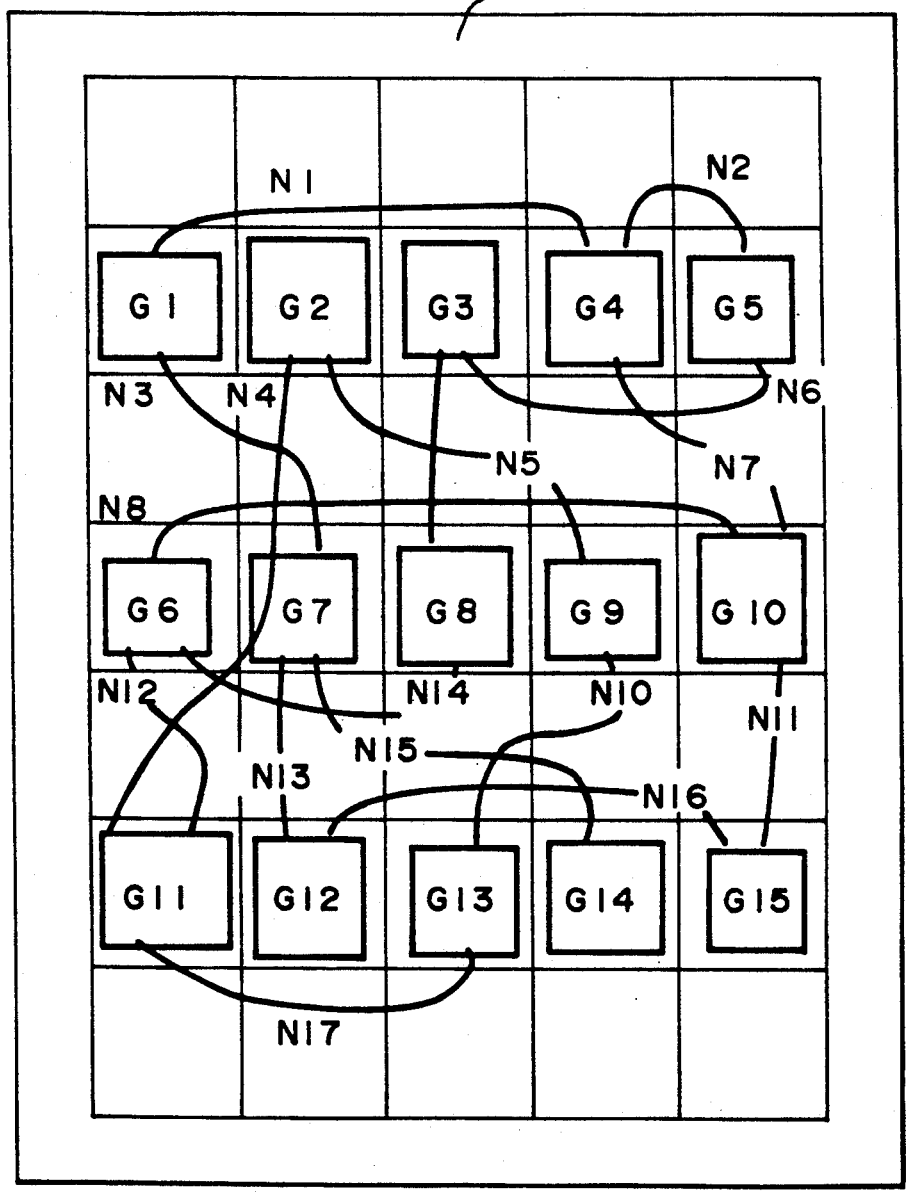

With reference to FIG. 7, placement element sets G1 to G15, which are collected by the above described placement element collection means 4 and which are somewhat different in area, are suitably assigned to placement region lattice elements P11 to P35 of the above described lattice like model 8. N11 to N17 denote connection relations. By assigning the placement element sets G1 to G15 having different areas to the placement region lattice elements P11 to P35 of the lattice-like model 8 in one-to-one correspondence, it becomes unnecessary in placement improvement to consider the effect caused by difference in area.

After all of the placement element sets G1 to G15 and wiring region lattice elements R11 to R45 are assigned to the lattice-like model 8 by the modeling means 5 as heretofore described, optimum placement positions of the placement element sets G1 to G15 in the lattice-like model 8 are determined by the placement element set placement optimization means 6.

The placement optimization system aided by CAD according to the present invention generates a plurality of placement element sets having close connection relations and nearly equivalent areas on the basis of circuit connection information including a plurality of placement elements, i.e., circuit elements, assigns those placement element sets to the lattice-like model, and determines placement positions of respective placement element sets on that lattice-like model. Therefore, it is not necessary to consider the effect of difference in area among placement elements at the time of placement improvement, resulting in a reduced computer cost.

Figure 8:
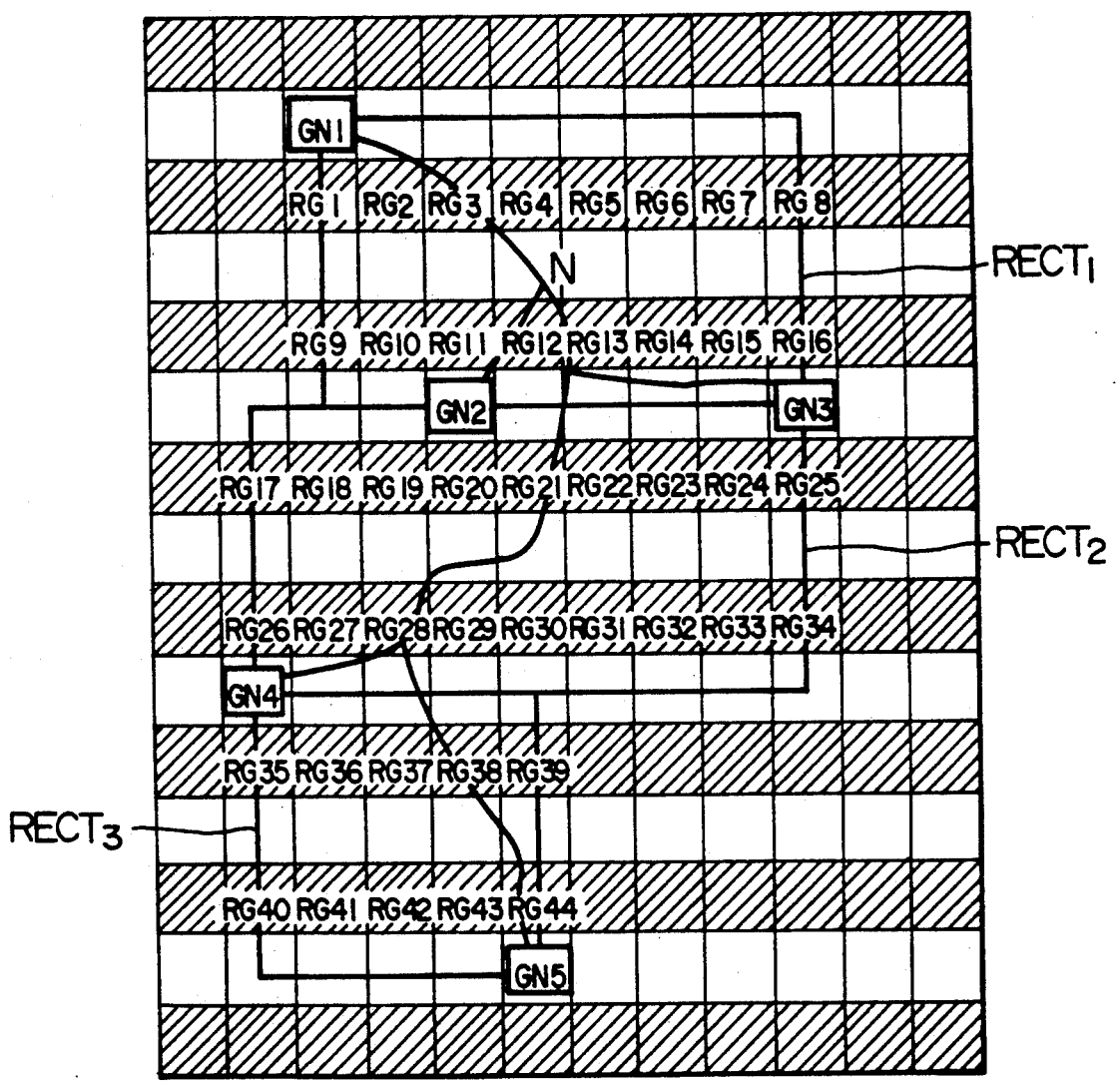
FIGS. 8 and 9 are diagrams illustrating the processing of rectangle generation.

FIG. 8 shows an example of generation, in rectangle generation means, of a rectangle used to set the degree $C_{ij}$ of wiring crowdedness into a wiring crowdedness region on the basis of the extent of placement elements connected to one wiring. The evaluation function value H expressed by equation (6) is derived from the degree $C_{ij}$ of wiring crowdedness which is set by the rectangle. The above described rectangle is set on the basis of the assumption that a plurality of wirings interconnecting placement element sets and generating that rectangle pass through the above described rectangle.

With reference to FIG. 8, N denotes connection relations caused by arbitrary wiring. GN1 to GN5 represent placement elements having connection relations with respect to the connection relations N. RECT1 to RECT3 denote rectangles generated from the extent of the placement element sets GN1 to GN5 connected to wiring having connection relations N. RG1 to RG44 denote wiring region lattice elements included in the generated rectangles RECT1 to RECT3.

As for rectangle generation, the minimum rectangle RECT1 including all placement element sets (GN1 in this example) existing in the highest placement region lattice row among placement region lattice rows whereon placement element sets GN1 to GN5 connected to the wiring having connection relations N are present and all placement element sets (GN2 and GN3 in this example) existing in a second placement region lattice row is first generated. In the same way, the minimum rectangle RECT2 including all placement element sets GN2 and GN3 existing in the second placement region lattice row and all placement element set GN4 existing in a third placement region lattice row is then generated. Finally, the minimum rectangle including all placement element set GN4 existing in the third placement region lattice row and all placement element set GN5 existing in a fourth placement region lattice row is generated.

Thereafter, a predetermined value is set as the degeee of wiring crowdedness relating to wiring having connection relations N with the wiring region lattices RG1 to RG44 surrounded by all of the generated rectangles RECT1 to RECT3.

Figure 9:
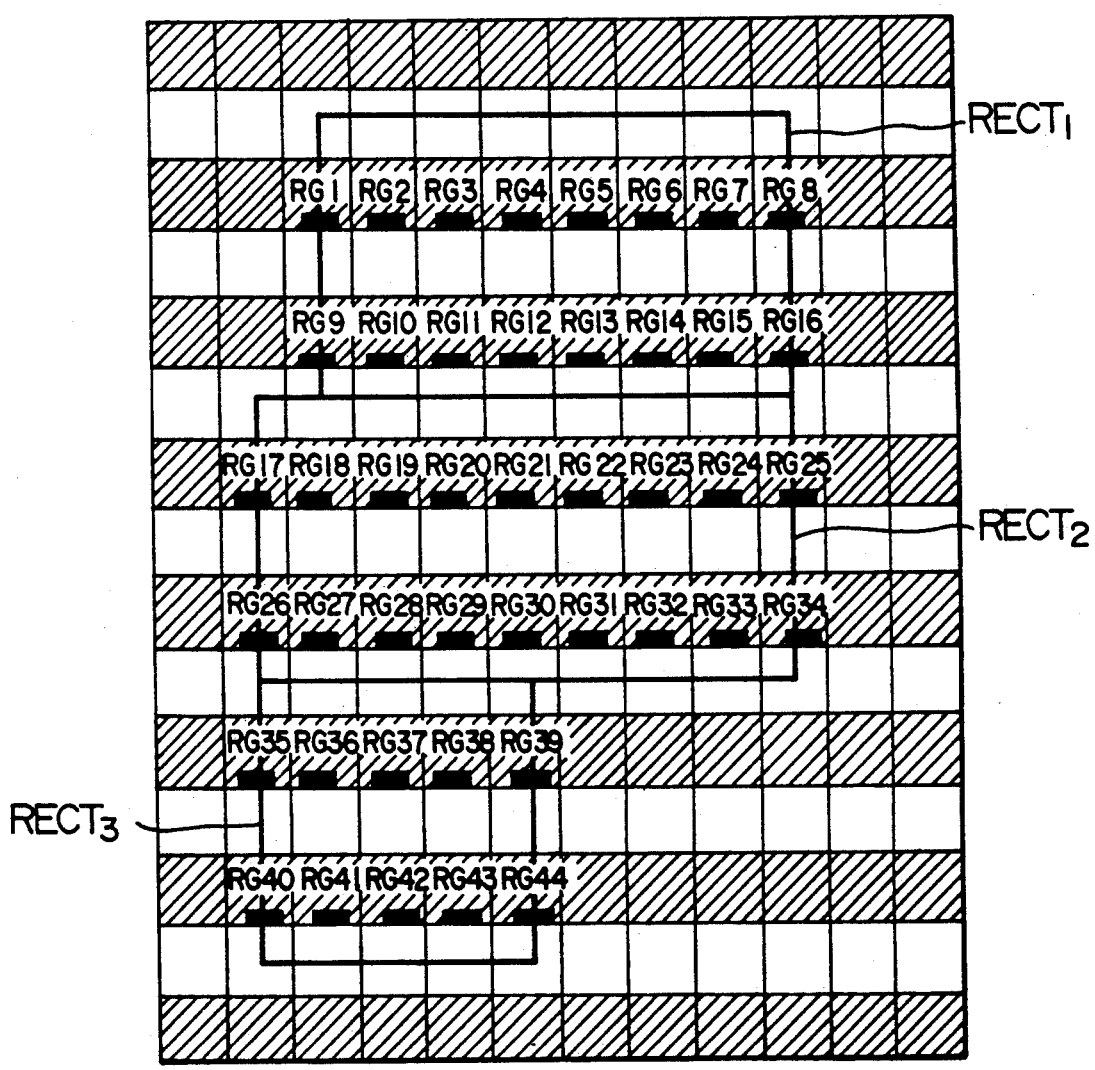

FIG. 9 shows how the degrees of wiring crowdedness relating to wiring having the connection relations N set by rectangles, which have been generated as shown in FIG. 8, are set for respective wiring region lattice elements by using thick bar graphs. The degree of wiring crowdedness shown in FIG. 9 is expected to occur when wiring processing is actually performed with respect to the connection relations N. Processing heretofore described is performed with respect to all connection relations.

The sum, with respect to all connection relations, of the degrees of wiring crowdedness set in wiring region lattice elements surrounded by a plurality of rectangles, which are generated from the state of extent of relating placement element sets by respective connection relations, is held in an accumulator corresponding to each wiring region lattice element. From the information of the degree of wiring crowdedness, the evaluation function value H is derived by using equation (6). Owing to the processing heretofore described, the height of each wiring region based upon the degree of wiring crowdedness, which is expected when wiring processing is actually performed, can be derived and evaluation directly coupled to the result of layout can be performed.

The above described rectangle generation is applicable to not only placement set elements but also individual placement element which are not collected.

Since the placement optimization system aided by CAD of the present invention uses a plurality of rectangles generated from the extent of placement elements connected to each wiring, a state change can be sensed with a very high sensitivity at the time of placement improvement and the optimum placement can be derived efficiently. Further, by generating rectangles conforming to rough wiring, placement results with high quality can be derived.

Embodiment 2

Figure 10:
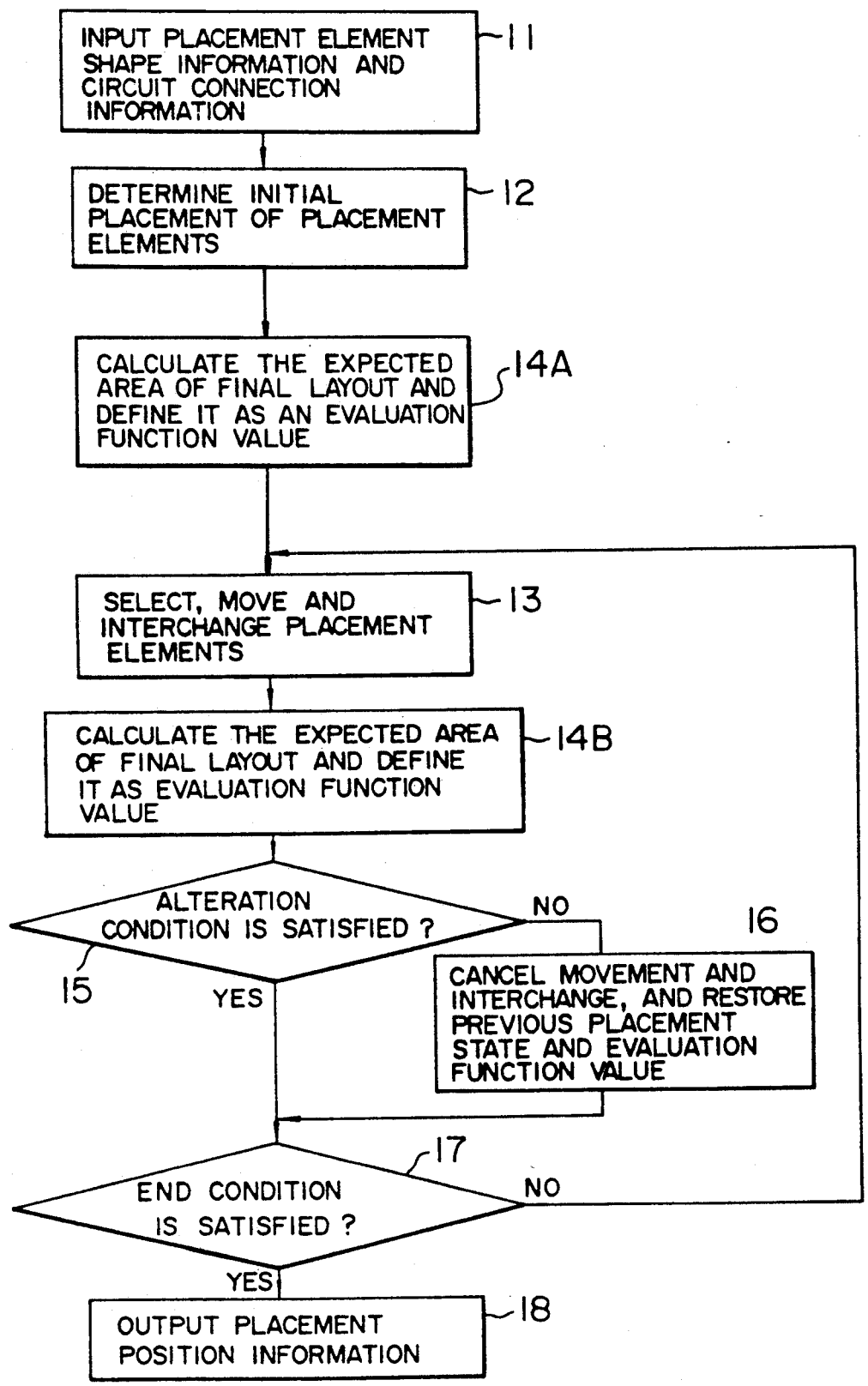
FIG. 10 is a flow chart illustrating the processing flow of a placement optimization system in a second embodiment of the present invention.

The processing flow in an embodiment of a placement optimization system according to the second aspect of the present invention is shown in FIG. 10. The placement optimization system comprises processing steps hereafter described.

Input means 11 takes placement element shape information and circuit connection information into the system. Initial placement means 12 initially places all placement elements. Placement alteration means 13 moves and interchanges placement elements. Final area estimation means 14 calculates the area of the final layout estimated in the placement state and defines it as the evaluation function value. Alteration condition judgment means 15 judges a change between the evaluation function value before placement alteration and that after placement alteration. If an interchange condition is satisfied, the interchange is executed as it is. Otherwise, interchange cancel means 16 restores the state before interchange.

Figure 11:
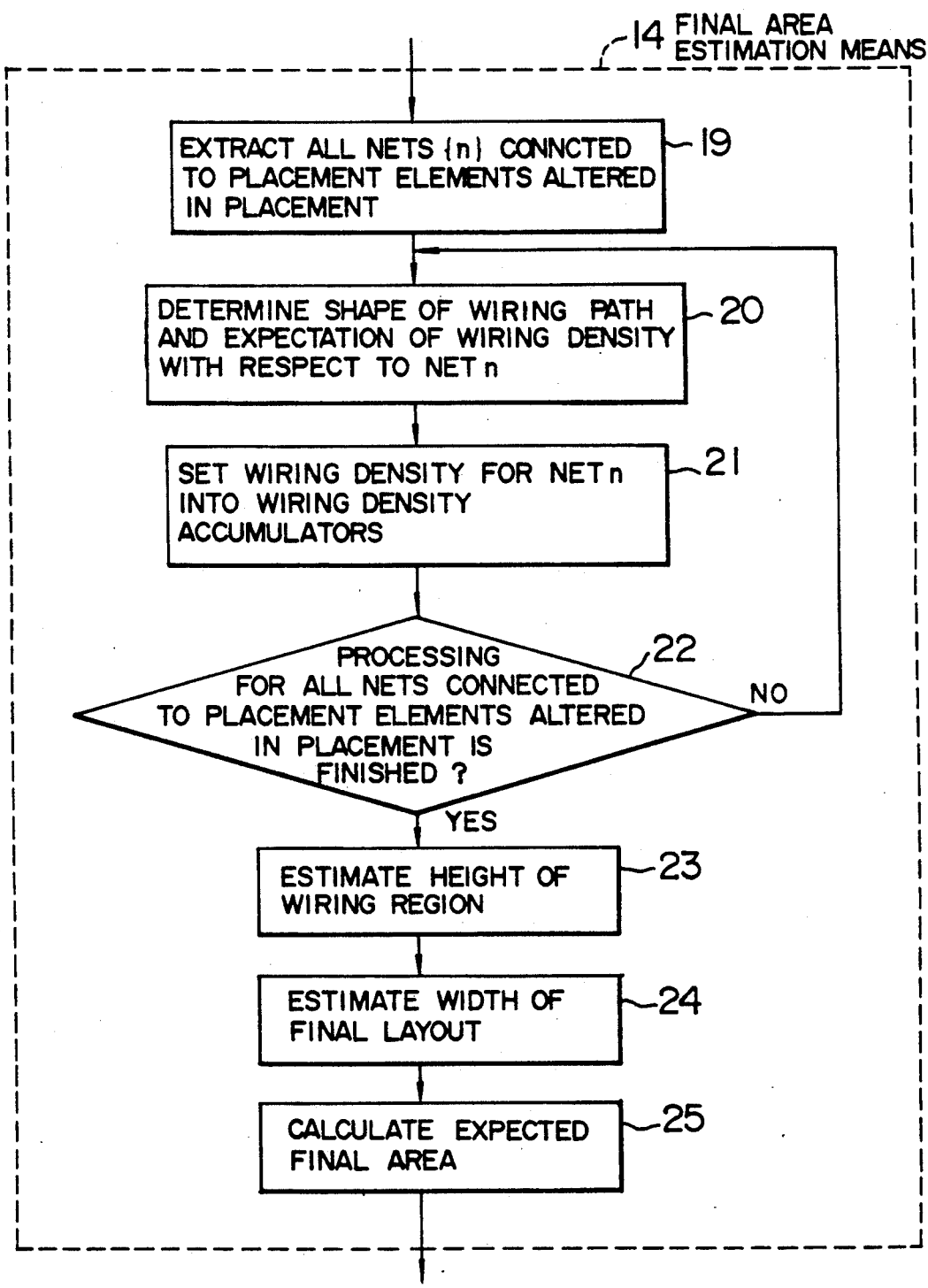
FIG. 11 is a diagram illustrating another example of processing flow in a placement optimization system of the present embodiment.

As shown in FIG. 11, the final area estimation means 14 comprises connection net extraction means 19 for extracting a set $\{n_i\}$ of all nets connected to placement elements altered in placement by the placement alteration means 13, wiring path determination means 20 for determining the shape of wiring path and expectation of wiring density expected in the final layout result with respect to a net $n_i$ which is an element of the above described net set $\{n_i\}$ extracted by the connection net extraction means 19, wiring density setting means 21 for setting expectation of the above described wiring density into all wiring density accumulators through which the above described wiring path determined by the wiring path determination means 20 passes, subject net judgment means 22 for judging whether processing of the means 20 and 21 has been finished for all elements of the above described net set $\{n_i\}$ or not, wiring region height estimation means 23 for estimating the height of the wiring region in the final layout result on the basis of setting situation of the wiring density set into the above described wiring density accumulators, final width estimation means 24 for estimating the final width of the layout in the final layout resulting, and expected final area calculation means 25 for calculating the area of the final layout result expected from the above described height of the wiring region and the above described final width.

Principal means included in the final area estimation means 14 will hereafter be described in detail.

Figure 12:
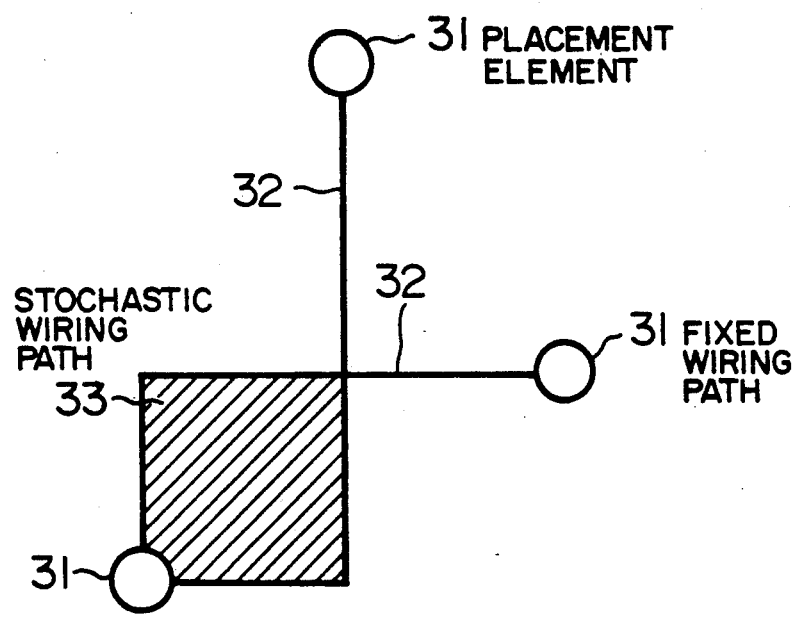
FIG. 12 is a diagram illustrating the principle of a method for determining the shape of wiring path and expectation of wiring density in wiring path optimization means of the present embodiment.

In the wiring path determination means 20, the shape of the wiring path and the expectation of the wiring density for the subject net are determined. Processing performed in the means 20 will now be described by referring to FIGS. 12 to 14.

First, on the basis of the placement state at the time of execution of processing, phase relationship of placement elements connected to the net to be processed can be derived. If the wiring path is implemented with the shortest distance, the shape of the wiring path is roughly divided, on the basis of positional relations of a placement element 31, into a portion of a fixed wiring path 32 having a path uniquely determined and a partial wiring path of a stochastic wiring path 33 stochastically expected to be passed through. In case the wiring path is thus implemented with the shortest distance, the pattern of wiring path is uniquely determined with respect to the position relations of placement elements connected to the net as exemplified in FIGS. 13A1 to 13B24.

That is to say, in case the number of placement elements connected to the above described net is two, there are four kinds of partial path patterns as shown in FIGS. 13A1 to 13A4. In case the number of placement elements connected to the above described net is three, there are 24 kinds of partial path patterns as shown in FIGS. 13B1 to 13B24.

Figure 14:
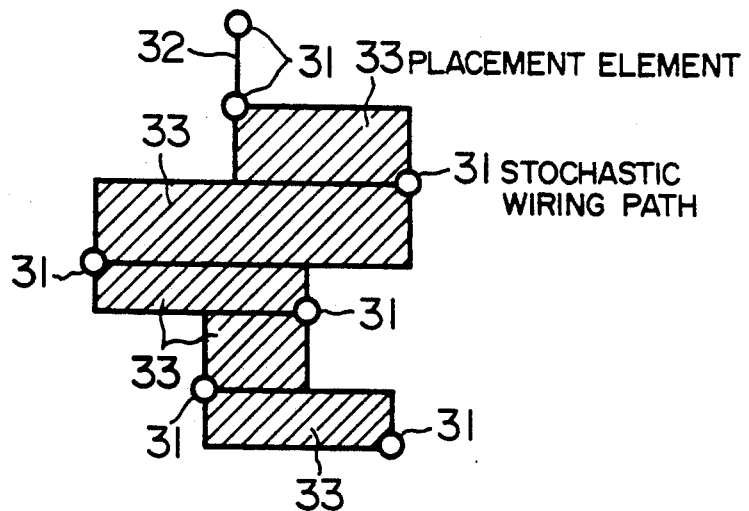
FIG. 14 is a diagram illustrating a wiring path pattern in the case where the number of placement elements to be connected is not less than four.

Further, in case the number of placement elements connected to the above described net is four or more, the shape of the above described wiring path is determined, on the basis of positional relations of placement elements 31, by a combination of a fixed wiring path 32 and stochastic paths 33 stochastically expected to be passed through as exemplified in FIG. 14. The shape of the wiring path shown here is based upon the assumption that the wiring path is determined by the shortest distance in rough wiring processing for determining the path to be passed through by wiring after the placement processing. In case the wiring path is determined by criteria other than the shortest distance in the above described rough wiring processing, it is more efficient to determine the shape of wiring path by considering the criteria of the rough wiring processing.

Figure 15:
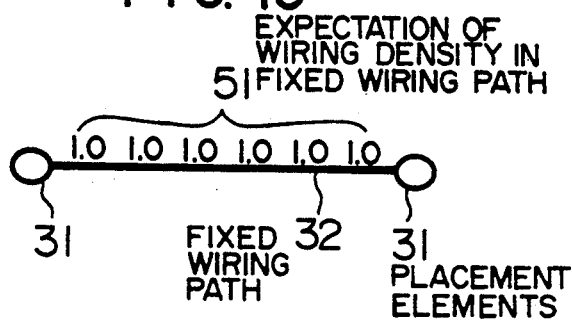
FIGS. 15 to 17 are diagrams illustrating the method for setting a wiring density in wiring density setting means of the present second embodiment.
Figure 16:
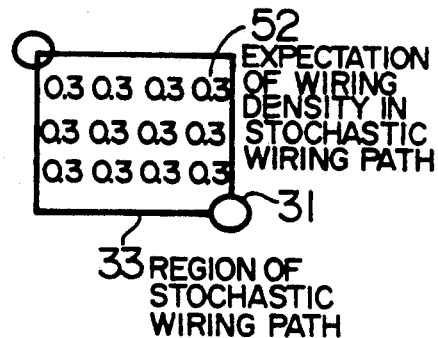
Figure 17:
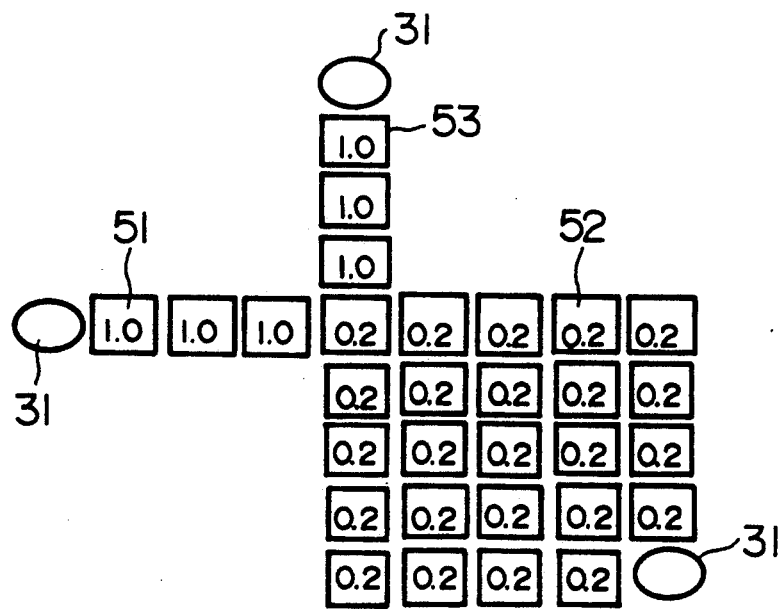

FIGS. 15 to 17 show examples of expectation of the degree of wiring crowdedness, or more generally wiring density in each of the above described partial wiring path. Expectation 51 of a fixed wiring path 32 shown in FIG. 15 is 1.0. As expectation 52 of a stochastic wiring path 33 shown in FIG. 16, a value which is in inverse proportion to the area indicated by the above described stochastic wiring path is determined. In the example, a value 0.3 has been chosen.

In accordance with the method heretofore described, the shape of the above described wiring path and the expectation of wiring density in each partial wiring path are determined for each net by considering the wiring path in the final layout. As a result, the area of the final layout estimated by using the above described wiring density can represent the actually obtained layout result with high precision.

On the basis of the shape of wiring path and the expectation of the wiring density determined by the above described wiring path determination means 20, the wiring density setting means 21 sets a wiring density relating to the subject net again. FIG. 17 shows an example wherein a wiring density accumulator is set into the wiring region and the wiring density relating to one net is set into a wiring density accumulator 53. Into wiring density accumulators located on the fixed wiring path, expectation 51 (with a value of 1.0) of wiring density for the fixed wiring path is set. Into wiring density accumulators located on the stochastic wiring path, a wiring density 52 (with a value of 0.2) for the stochastic wiring path is set. In case the wiring density relating to the net is set again, the expectation of wiring density before placement alteration is first subtracted from the contents of the wiring density accumulator. After the placement alteration has been performed, the expectation of wiring density after placement alteration is added to the contents of the wiring density accumulator. If the above described wiring density is set again with respect to all nets extracted by the connection net extraction means 19, distribution of wiring densities relating to all nets in the placement state at that point of time can be obtained by detecting the wiring density set in the wiring density accumulator.

In the processing of the above described means 20, 21 and 22, wiring densities relating to all nets are stored into wiring density accumulators. In the wiring region height estimation means 23, the height of each wiring region is then estimated on the basis of the distribution of wiring densities set into the above described wiring density accumulators.

In this processing, the height of the wiring region is estimated by representing the distribution of wiring density in each wiring region statistically. To be exact, the height of the wiring region is determined by the maximum value of the wiring density in each wiring region. In case evaluation is performed in local items such as the maximum value of the above described wiring density, however, improvement is advanced only in such a direction that the maximum wiring density is lowered. General improvement in other portions cannot be expected. That is to say, there is a danger of falling into a local solution. In the wiring region height estimation means 13, the entire wiring region can be generally watched by handling the distribution of wiring density statistically. In placement improvement, therefore, efficient improvement which does not fall into a local solution can be anticipated.

Figure 18:
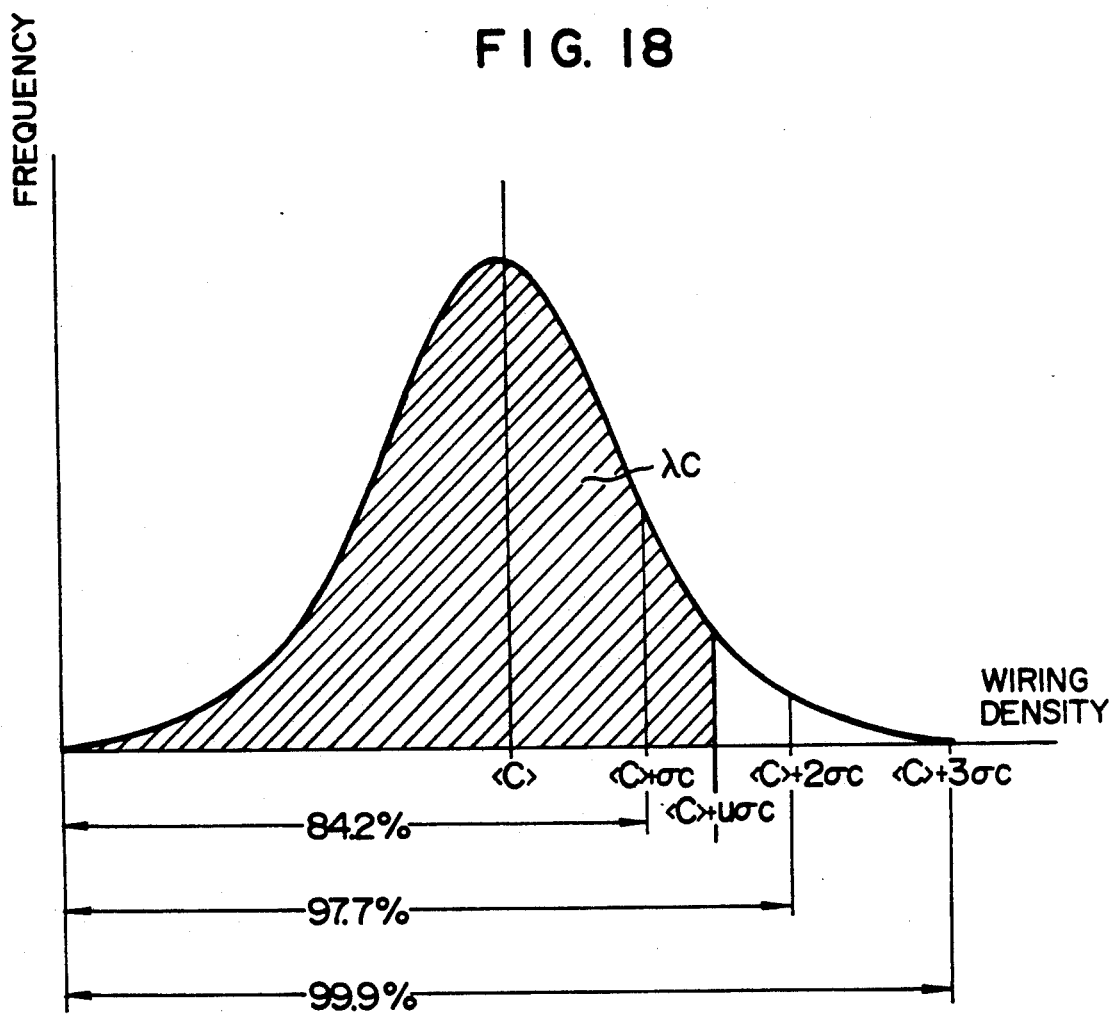
FIG. 18 is a diagram illustrating a method for estimating the height of a wiring region in wiring region height estimation means of the present embodiment.

FIG. 18 shows the distribution of wiring density expected in an arbitrary wiring region R. It is supposed now that the distribution of wiring density in each wiring region conforms to normal distribution. For a large-scale problem, it is considered that the frequency distribution becomes normal distribution as shown in FIG. 18. With reference to FIG. 18, solid line $<C>$ represents the average value of wiring density in the above described wiring region R, and $\sigma c$ represents the standard deviation value of wiring density in the above described wiring region R. A shaded portion $\lambda_c$ represents a region of distribution of wiring density C satisfying the relation $C < <C> + u \cdot \sigma_c$ when the coefficient of $\sigma_c$ has an arbitrary value u. As shown in FIG. 18, relationship between u in the shaded portion and the quantity of contained distribution is the same as that of FIG. 4. The height H of the wiring region is expressed as $H = h \cdot (<C> + u \cdot \sigma_c)$. This equation is obtained by expressing the distribution of wiring density statistically and approximating the height of the wiring region. Character h is a coefficient relating the wiring density to the height of the wiring region. The height H of the wiring region can be derived by $$H = h \cdot \{<C> + u \cdot (<C^2> - <C>^2)\} \quad (7)$$

where $<C^2>$ is the average value of square of the wiring density C in the wiring region.

Figure 19:
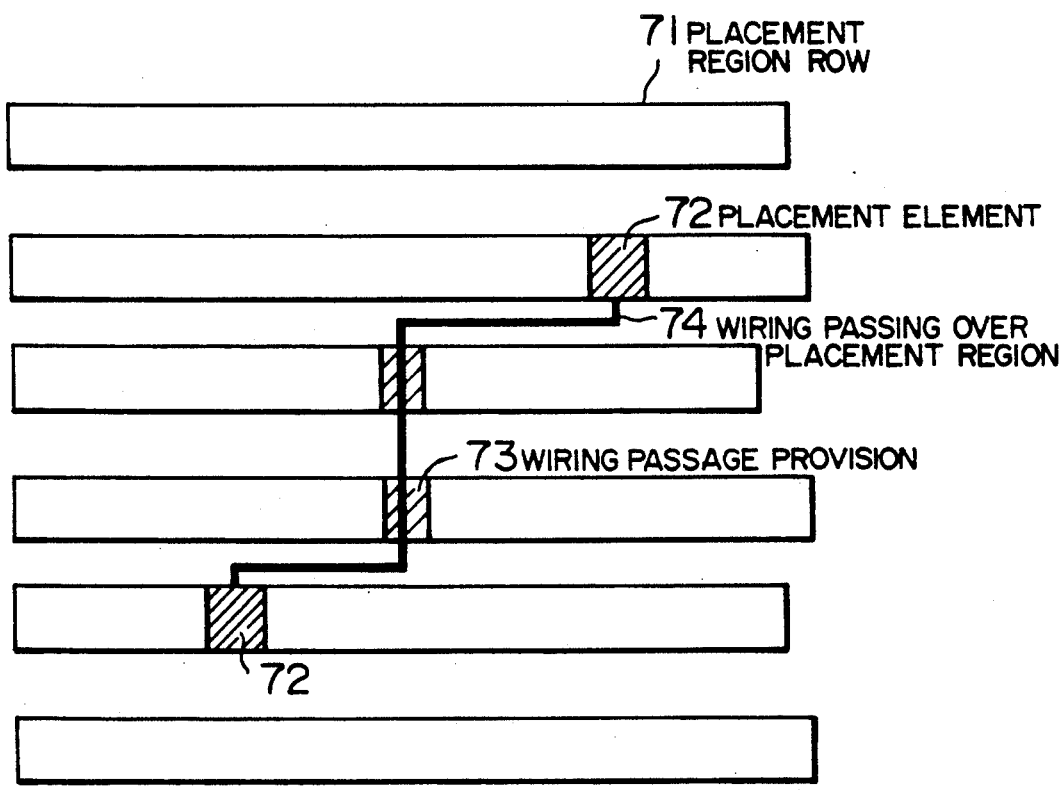

Final width estimation means 24 estimates the width in the final layout result on the basis of the distribution state of length of the placement region. In case placement regions are arranged in a row form as shown in FIG. 19 and wiring 74 passing over placement region which strides over a placement region row 71 is to be implemented, the above described wiring 74 passing over placement region must use a wiring passage region prepared beforehand in a placement element on the placement region row 71 which is stridden over by the above described wiring 74, or a wiring passage provision 73 for passing wiring must be added. In case there exists wiring 74 passing over placement region which cannot be absorbed by the above described wiring passage region prepared beforehand in each region among the wiring densities stored into wiring density accumulators on the placement region by the above described wiring density setting means 21, as many wiring passage provisions 73 as the above described wirings passing over placement region which cannot be absorbed by the above described wiring passage regions are added, and the sum of the sum total of lengths of the above described added wiring passage provisions 73 and the sum total of lengths of placement elements on the above described placement region is regarded as the length of the above described placement region row 71. By expressing the distribution of width in the desired final layout statistically on the basis of situation of distribution of lengths of all placement region rows calculated as heretofore described, the width in the final layout is estimated. FIG. 20 shows distribution of lengths of all wiring region rows. It is supposed now that the distribution of lengths of the above described placement region rows conforms to normal distribution. With reference to FIG. 20, solid line $<W>$ represents the average value of lengths of the above described placement region rows whereas $\lambda_w$ denotes the standard deviation value of lengths of the above described placement region rows. A shaded portion $\lambda_w$ indicates a region of distribution of the length W of placement region rows satisfying the relation $W < <W> + v \cdot \sigma_w$ when the coefficient of $\sigma_w$ has an arbitrary value v.

The expected final area calculation means 25 calculates the area of the expected final layout by using the height of the above described wiring region estimated by the above described placement region height estimation means 23 and the width of the above described final layout estimated by the above described final width estimation means 24.

As heretofore described, the final area estimation means 14 calculates the area of final layout expected in each placement state and defines it as the evaluation function value. Placement improvement is performed while evaluating the above described evaluation function value before and after the placement alteration in the above described alteration condition judgment means 15. As a result, the layout result of the minimum area can be obtained.

In order to describe the present invention concretely, the processing method will now be described by referring to the example of Table used in the embodiment 1.

In the present problem as well, it is now assumed that all terminals possessed by placement elements are located on the same plane and wiring is implemented on one side of placement elements.

As the wiring result satisfying the circuit connection information shown in Table 1, the wiring of FIG. 2 is obtained as an example in the same way as the embodiment 1.

If a wiring density accumulator is set on each terminal in the result of placement and wiring shown in FIG. 2 and wiring densities are set for all nets, the same result as FIG. 3 is obtained. Since the wiring implemented now passes always through only one wiring region, the shape of wiring path for all nets becomes that shown in FIG. 13A1 and all expectations of the wiring density become 1.0.

Since wiring passing over the placement region is not present and only one wiring region is present, the width of the final layout is uniquely determined by the length of the placement region which is singly present in the present layout. By starting with the above described initial placement state, repeating the placement alteration, setting wiring densities again on all such occasions, estimating the height of the wiring region on the basis of distribution of wiring densities set in wiring density accumulators, defining the expected area of the final layout as the evaluation function value, evaluating the difference between the evaluation function value after placement alteration and the evaluation function value before placement alteration, and continuing placement improvement so as to minimize the evaluation function value, the layout result with the minimum area can be obtained.

In accordance with the present invention, the area of the final layout is directly evaluated and a single item, i.e., the area is evaluated by estimating the area of the final layout, defining it as the evaluation function value, and performing placement improvement so as to minimize the above described evaluation function value in the above described configuration. Therefore, the labor of defining optimum values of a plurality of coefficients in an evaluation function for determining evaluation weights of items to be evaluated with respect to the circuit scale is saved, and such placement positions of placement elements as to minimize the final area can be determined.

Further, by estimating the height of the wiring region on the basis of wiring densities relating to all nets, estimating the width of the final layout result on the basis of distribution of length of the wiring region, and defining the estimated final area calculated from the above described wiring region height and final width as the evaluation function value of placement improvement, placement situation can be evaluated on the whole.

Further, by determining the shape of wiring path of the above described net and expectation of wiring density in a partial path included in the above described wiring path on the basis of positional relationship of placement positions of placement elements connected with respect to each net, detection of wiring density reflecting the wiring path in the final layout result with high precision becomes possible.

Further, by adding the expectation of the above described wiring density to contents of the wiring density accumulator set in the wiring region passed by the above described wiring path, it becomes easy to handle the placement optimization in a computer.

Further, by approximating the distribution of wiring density stochastically and estimating the height of wiring region, the height of the wiring region can be expressed on the whole on the basis of situation of wiring distribution.

Further, by estimating the final width on the basis of distribution of length of the placement region with due regard to the number of wiring conductors passing over the placement region, it is possible to estimate the final width reflecting the final layout result more intensely.

Embodiment 3

Figure 21:
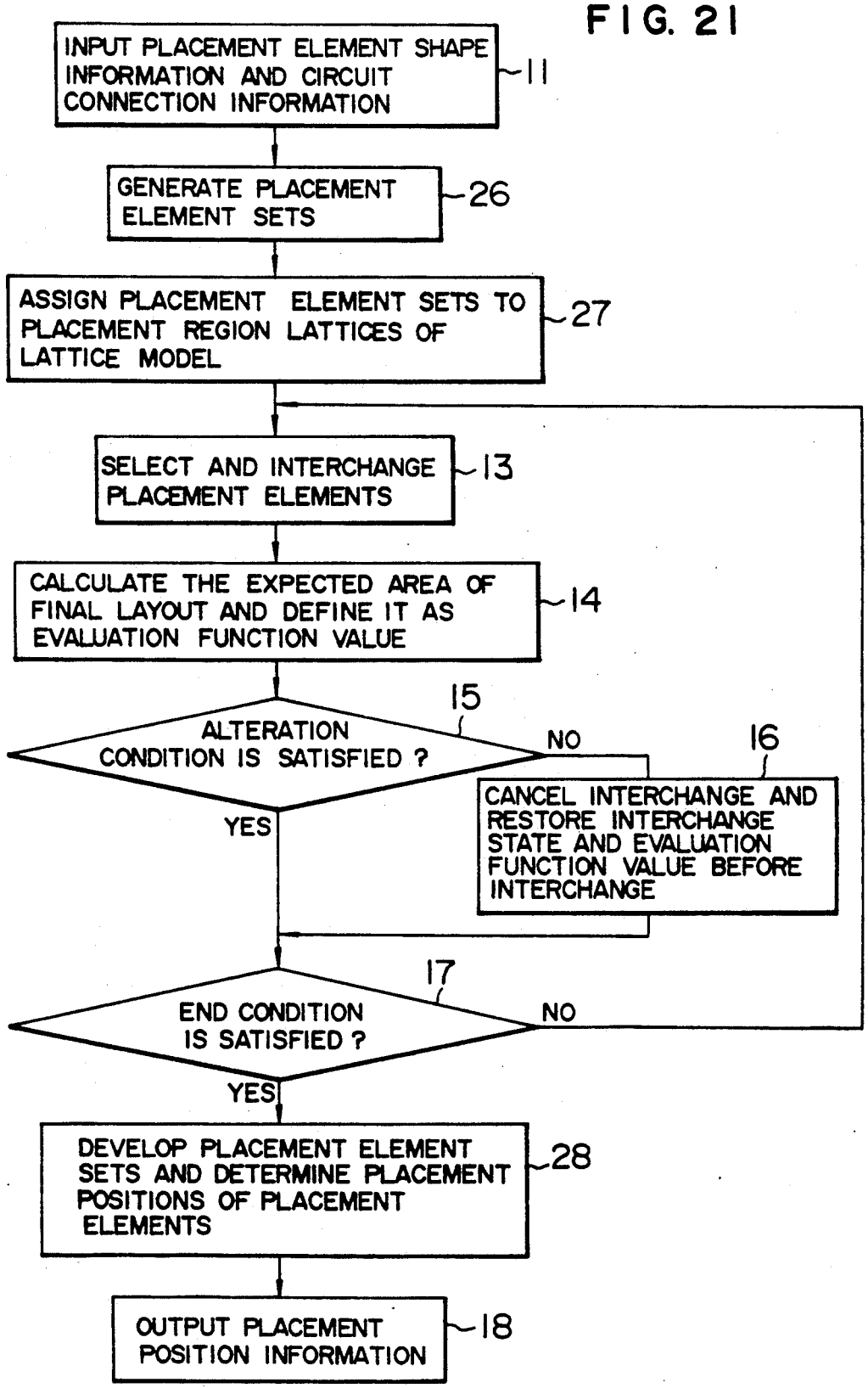
FIG. 21 is a diagram illustrating the processing flow of a placement optimization system in a third embodiment of the present invention.

The processing flow of an embodiment of a placement optimization system according to the third aspect of the present invention is shown in FIG. 21.

The placement optimization system comprises the following processing steps.

Input means 11 takes the placement element shape information and circuit connection information into the system. On the basis of the above described placement element shape information and the above described circuit connection information inputted by the above described input means 11, placement element collection means 26 generates placement element sets so that the connection relationship may become close and the sum total of areas of all placement elements collected into respective sets may become equivalent and defines each of the above described placement element sets as a new placement element.

Modeling means 27 assigns placement elements newly generated by the above described placement collection means 26 to placement region lattice elements of a lattice model.

Placement alteration means 13 interchanges placement elements assigned to the lattice model. At this time, the placement region of each placement element is secured on the lattice model, and collection is performed by the above described placement element collection means 26 so that areas of placement element sets may become equal. Therefore, it is possible to suppress the influence of placement alteration on placement positions of other placement elements and the influence of wiring density relating to the net connected to placement elements other than the placement elements which has undergone placement interchange to the minimum.

Final area estimation means 14 calculates the area of the final layout estimated in that placement state and defines it as the evaluation function value. Alteration condition judgment means 15 judges the change between the evaluation function value before placement change and that after placement change. If a predetermined interchange condition is satisfied, the interchange continues to be executed. Otherwise, placement alteration cancel means 16 restores the state before interchange. End condition judgment means 17 judges whether a predetermined end condition is satisfied or not. If the end condition is not satisfied, the processing is returned to the placement alteration means 13.

If the end condition is satisfied, processing is advanced to placement element set development means 28, which develops placement elements at the time of input included in each placement element set. Output means 18 outputs placement position information, processing being thus finished.

A lattice model used in the modeling means 27 in another embodiment of the present invention is identical with the lattice model 8 of FIG. 6.

An example of appropriate assignment of placement element sets G1 to G15 having somewhat different areas collected by the placement element collection means 26 to the elements P11 to P35 of the above described lattice model can be expressed in the same way as FIG. 7.

After all placement element set lattice element set lattice elements and wiring region lattice elements are thus assigned to lattice model elements by the modeling means 27, optimum placement positions of placement element sets on the lattice model are determined.

Placement element set development means 28 of FIG. 21 develops the placement element set and determines placement positions of placement elements at the time of input included in the above described placement element set. In order to obtain a better placement state of placement element level, placement elements included in the above described placement element set are rearranged at this time. Further, if the placement element 142 included in a placement element set G assigned to a placement region lattice 144 on the above described lattice model is so developed as to jump over the placement region lattice 144 on the basis of the placement state as shown in FIG. 22, a problem caused by falling into a local solution when collecting placement elements in the above described placement element collection means 26 can be solved.

In the present embodiment, placement elements having close connection relations are so collected that the sums of areas of all placement elements included in the placement element set may be equivalent. By defining the above described placement element set as a new placement element, placement improvement is performed on the lattice model. As a result, the number of placement elements to be improved in placement can be reduced. Further, at the time of placement alteration, computer cost caused by interchange of placement elements which are different in width can be reduced.

Further, by assigning placement element sets to placement region lattice in the lattice mode and performing placement interchange between placement region lattices, the influence of placement alteration on other placement elements can be removed.

Further, by setting a wiring density accumulator for each wiring region lattice in the lattice model, the wiring density can be detected on the whole.

Further, by developing the placement element set assigned to each placement region lattice and redetermining the placement positions of placement elements included in the above described placement element set, better placement positions of placement element level can be determined. By determining placement positions across a placement region lattice, the problem of performing such collection as to cause a local solution in the placement element collection means can be solved.

We claim:

1. A placement optimization system aided by CAD comprising:

input means for inputting circuit connection information including a plurality of placement elements;
   placement optimization means for determining a degree of wiring crowdedness based on said circuit connection information and optimizing placement positions of said placement elements by conducting an evaluation of a height of a wiring region statistically approximated from a distribution of the degree of wiring crowdedness and by performing repetitive improvement of the placement positions based on said evaluation; and
   output means for outputting placement position information derived by said placement optimization means.

2. A placement optimization system aided by CAD according to claim 1, wherein said placement optimization means comprises:

placement element collection means for collecting a plurality of placement elements having close connection relations in circuit connection information into a plurality of placement element sets, the sets having equal areas;
   modeling means for modeling placement element sets and wiring region lattices derived by said placement element collection means into lattice-like models;
   placement element set placement optimization means for determining optimum placement positions in lattice-like models of all placement element sets by repeating placement improvement on the basis of connection information between said placement element sets, and
   set development means for opening said plurality of placement element sets and for determining placement positions of all placement elements forming respective placement element sets.

3. A placement optimization system aided by CAD according to claim 2, wherein said placement optimization means generates a plurality of rectangles by considering rough wiring on the basis of extent of placement elements or placement element sets connected to each wiring on the basis of circuit connection information, and said placement optimization means sets the degree of wiring crowdedness on the basis of said plurality of rectangles.

4. A placement optimization system aided by CAD according to claim 1, wherein said placement optimization means generates a plurality of rectangles by considering rough wiring on the basis of extent of placement elements or placement element sets connected to each wiring on the basis of circuit connection information, and said placement optimization means sets the degree of wiring crowdedness on the basis of said plurality of rectangles.

5. A placement optimization system aided by CAD for optimizing, in a circuit including mutually related placement elements, placement positions of the placement elements, said placement optimization system comprising:

input means for inputting circuit connection information including a plurality of placement elements and shape information of said placement elements;
   initial placement means for initially placing said placement elements at respective placement positions;
   placement alternation means for moving and interchanging said placement elements and for locally altering the placement positions;
   final area estimation means for calculating, on the basis of a placement state obtained at each time of placement alteration, an area of a final layout result expected in said placement state and defining the calculated area as an evaluation function value assigned to the respective placement alteration;
   alternation condition judgment means for evaluating a difference between said evaluation function value assigned to a first said placement alteration and the evaluation function value assigned to a second said placement alteration successive to the first placement alteration and thereby judging satisfaction of a condition of the second placement alteration;
   placement alteration cancellation means responsive to nonsatisfaction of said condition of said second placement alteration in said alteration condition judgment means to cancel said second placement alteration and restore the placement state and the evaluation function value assigned to said first placement alteration; and
   end condition judgment means for judging satisfaction of a given end condition, said end condition judgment means being responsive to satisfaction of said end condition to cause an output means to generate placement position information of said placement elements and responsive to nonsatisfaction of said end condition to activate said placement alteration means.

6. A placement optimization system aided by CAD according to claim 5, wherein said final area estimation means comprises:

connection net extraction means for extracting all nets connected to the placement elements altered in placement;
   wiring path determination means for determining a shape of wiring path and expectation of wiring density with respect to the nets extracted by said connection net extraction means;
   wiring density setting means for setting expectation of said wiring density into the wiring path determined by said wiring path determination means;
   wiring region height estimation means for estimating a height of a wiring region in the final layout result on the basis of said placement state expected from a distribution state of the wiring density in each placement state;

final width estimation means for estimating a width of said final layout result expected from said placement state; and expected final area calculation means for calculating the area of the final layout result on the basis of the wiring region height estimated by said wiring region height estimation means and said expected final width estimated by said final width estimation means.

7. A placement optimization system aided by CAD according to claim 6, wherein on the basis of positional relationship information of placement positions of all placement elements connected to the nets, the wiring path determination means determines a type of an expected wiring path according to a number of the placement elements connected to said nets and a shape representing said placement positional relationship information and determines a shape of the wiring path formed of partial paths including a fixed wiring path and a stochastic wiring path and an expectation value of a wiring density in each of the partial paths.

8. A placement optimization system aided by CAD according to claim 6, wherein said wiring density setting means comprises wiring density accumulators provided in the wiring region and means for adding the expectation values of the wiring density relating to said nets to contents of all the wiring density accumulators provided on the expected wiring path determined by said wiring path determination means.

9. A placement optimization system aided by CAD according to claim 8, wherein on the basis of distribution situation of wiring density set in said wiring density accumulators for all nets, said wiring region height estimation means calculates the height of wiring region by handling said wiring density distribution statistically and calculates the height of final layout result expected in that placement state.

10. A placement optimization system aided by CAD according to claim 6, wherein said final width estimation means calculates the width of the final layout result statistically on the basis of distribution of wiring region length.

11. A placement optimization system aided by CAD for optimizing, in a circuit including mutually related placement elements, placement positions of the placement elements, said placement optimization system comprising:

input means for inputting circuit connection information including a plurality of placement elements and shape information of said placement elements;

placement element collection means for generating placement element sets by collecting the placement elements having a close connection relationship in said circuit connection information in each set so as to make areas of the respective sets nearly equal to each other, and defining the placement element sets as new placement elements, and for generating circuit connection information relating to said placement elements sets, and defining the circuit connection information as new circuit connection information;

modeling means for assigning the placement elements to placement region lattices of a lattice model including placement region lattices and wiring region lattices;

placement alteration means for interchanging said placement elements on the lattice model to perform local placement interchange;

final area estimation means for calculating, on the basis of a placement state obtained at each time of execution of placement alteration, an area of a final layout result expected in said placement state and defining the area thus calculated as an evaluation function value assigned to the respective placement alteration;

alteration condition judgment means for evaluating a difference between said evaluation function value assigned to a first said placement alteration and the evaluation function value assigned to a second said placement alteration successive to said first placement alteration and for judging, on the basis of the evaluation, satisfaction of the second placement alteration;

placement alteration cancellation means responsive to nonsatisfaction of said second placement alteration in said alteration condition judgment means to cancel said second placement alteration and restore the placement state and the evaluation function value assigned to said first placement alteration;

end condition judgment means for judging satisfaction of an end condition, said end condition judgment means being responsive to satisfaction of the end condition to cause advancement to succeeding processing and responsive to nonsatisfaction of the end condition to activate said placement alteration means;

placement element set development means for opening all placement elements sets assigned to respective placement region lattices of said lattice model and for determining placement positions of all placement elements included in each placement element set; and output means for outputting placement position information.

12. A placement optimization system aided by CAD according to claim 11, wherein said final area estimation means eliminates influence of interchange on other placement element sets by interchanging placement element sets assigned to said placement region lattices in the lattice model, between said placement region lattices.

13. A placement optimization system aided by CAD according to claim 11, wherein said final area estimation means representatively detects wiring density by setting a wiring density accumulator for each of said wiring region lattices in the lattice model.

14. A placement optimization system aided by CAD according to claim 11, wherein said placement element set development means develops placement element sets assigned to placement region lattices of said lattice model and determines placement positions of all placement elements included in said placement element sets.

* * * * *